(12) United States Patent
Wendt et al.

(10) Patent No.: US 7,518,450 B2
(45) Date of Patent: Apr. 14, 2009

(54) DIGITAL AMPLIFIER

(75) Inventors: Matthias Wendt, Wuerselen (DE); Iain Mosely, Pangbourne (GB); F. Javier Esguevillas, Cambrils (ES)

(73) Assignee: NXP B.V., Eindhoven (NL)

( * ) Notice: Subject to any disclaimer, the term of this patent is extended or adjusted under 35 U.S.C. 154(b) by 6 days.

(21) Appl. No.: 10/552,057

(22) PCT Filed: Mar. 25, 2004

(86) PCT No.: PCT/IB2004/001009

§ 371 (c)(1),
(2), (4) Date: Apr. 30, 2007

(87) PCT Pub. No.: WO2004/091096

PCT Pub. Date: Oct. 21, 2004

(65) Prior Publication Data

US 2007/0273440 A1 Nov. 29, 2007

(30) Foreign Application Priority Data

Apr. 7, 2003 (EP) ................... 03100919

(51) Int. Cl.
*H03F 3/217* (2006.01)
(52) U.S. Cl. ............ 330/251; 330/207 A; 330/10; 327/112; 326/83

(58) Field of Classification Search ............ 330/251, 330/207 A, 10; 327/112; 326/83
See application file for complete search history.

(56) References Cited

U.S. PATENT DOCUMENTS

| | | | | |
|---|---|---|---|---|
| 5,253,155 A * | 10/1993 | Yamamoto | ............ | 363/71 |
| 6,127,885 A * | 10/2000 | Colangelo | ............ | 330/10 |
| 6,288,605 B1 * | 9/2001 | Botti et al. | ............ | 330/10 |
| 6,294,954 B1 * | 9/2001 | Melanson | ............ | 330/10 |
| 6,683,494 B2 * | 1/2004 | Stanley | ............ | 330/10 |
| 6,768,779 B1 * | 7/2004 | Nielsen | ............ | 375/297 |
| 6,987,418 B2 * | 1/2006 | Kim et al. | ............ | 330/10 |

* cited by examiner

*Primary Examiner*—Patricia Nguyen
(74) *Attorney, Agent, or Firm*—Aaron Waxler

(57) ABSTRACT

Recently, the use of class D audio amplifiers has become more and more widespread. In contrast to the generally employed class AB linear amplification technology, class D allows for improved efficiency. However, the class D principle is known for its poor distortion characteristics. According to the present invention, switching delays of the end stage (6) are measured and used for compensating distortions caused by the dead time of the end stage (6). This is done by modifying the switching delay of the power stage. In this way, the output pulse duration is corrected to reflect the input duty cycle. Advantageously, variations in the switching-time due to device property spread, aging, current and temperature may be compensated.

20 Claims, 3 Drawing Sheets

DIGITAL AMPLIFIER

The present invention relates to the field of digital amplifiers which directly convert digital signals to a power output. More specifically, the present invention relates to a digital amplifier, to a switching-timing corrector for correcting switching timing errors of switches of a bridge of a digital amplifier and to a method of correcting pulse-timing errors of switches of a bridge of a digital amplifier.

Several types of power-amplifier output stages have been developed. Conveniently, they were labeled as, e.g. class A amplifiers, class B amplifiers and class C amplifiers. More recently, class D amplifiers appeared. Class A, B, AB, and D are common in low-frequency audio designs and have some applications in other areas, such as servo-motor drives and RF amplification. Class C, class E and F types are usually only used in RF applications.

In recent years, in particular the class D amplifiers have become increasingly popular due to their drastically improved efficiency in contrast to the generally employed class AB linear amplification technology. Class D amplifiers are generally described in Carsten Nielsen, "High Fidelity PWM based Amplifier Concept for Active Speaker Systems with a very low Energy Consumption", (100th AES Convention, Copenhagen, May 1996, pre-print 4259), which is hereby incorporated by reference.

The development of class D amplifiers represents an effort to improve amplifier efficiency. Similar in scheme to a switching regulator, a class D amplifier, pulse-width-modulates the audio-input signal with a higher frequency square wave so that audio-signal information becomes the variations in pulse-width of the modulative signal. This modulation signal feeds a set of half bridge switches, usually called H-bridges, and each H-bridge consists of two power MOSFETs. Unlike with class A or B structures, the amplifier load or the loudspeaker is placed across the legs of the bridge instead of from the output to the ground. This configuration allows the amplifier to reproduce low-frequency signals as low as 20 Hz without requiring bipolar power supplies or without introducing a DC offset in the output.

In spite of becoming more and more popular, class D audio amplifiers are known for their poor distortion characteristics. Attempts were made to filter the modulated output to remove high-frequency signals and recover the amplified input signals. Filter configurations such as two-pole Butterworth filters, two-pole Chebyshev or two-pole Bessel filters are known which either did not deliver satisfying results or caused significant efforts and costs.

It is an object of the present invention to reduce distortions in digital amplifiers.

As used herein, the term "digital amplifier" applies to an amplifier which directly converts to a power output.

According to an exemplary embodiment of the present invention, the above object may be solved with a digital amplifier comprising a half bridge system with switches and a switching-timing correction circuit. An input signal and an output signal of the switches is applied to the switching-timing correction circuit. According to an aspect of the present invention, the switching-timing correction circuit corrects switching timing errors of the switches on the basis of pulse-timing errors of the input signal of the switches and the output signal of the switches.

According to an aspect of the present invention, it has been found out that a significant portion of the distortions of the digital amplifier are caused by pulse distortions by the switches in the power stage. In particular, according to the present invention it has been found that in the area of pulse distortions, the dead time of the switches is the dominant influencing factor causing unwanted distortions.

Accordingly, with the present invention as described above, a direct compensation of switching-timing errors such as a dead time behavior of the switches is directly compensated which allows to reduce the total harmonic distortion (THD) of the digital amplifier according to the present invention in a simple manner. In the case of a PWM amplifier with the switching-timing correction according to the present invention, advantageously, only a reduced feedback is required to reach satisfying THD figures.

Deadtime can also vary with the current in the switches, because current decay in the body diode may lead to variations in the off-time of a switch. Also, these variations may be compensated with the device/method of the present invention.

According to known solutions where a dead time of the switches is attempted to minimize by circuit adjustments, where costly trimming on every end stage is required, the present invention allows to make such individual trimming of every end stage superfluous. Furthermore, according to the present invention, variations over time and temperature may be compensated for.

According to an exemplary embodiment of the present invention as set forth in claim 2, the switching-timing of the switches is corrected by delaying at least one of a rising edge and a falling edge of a pulse of the input signal. This allows for a simple and quick correction of the timing errors.

According to another exemplary embodiment of the present invention as set forth in claim 3, an on/off difference between an on delay of a pulse supplied to the switches and an off delay of the pulse response output by the switches is used for generating an error signal, which error signal is used for correcting the switching-timing errors of the switches. This exemplary embodiment of the present invention allows for a very simple circuit configuration for determining the pulse-timing errors of the switches.

According to another exemplary embodiment of the present invention as set forth in claim 4, the error signal is generated from one switching cycle and influences switching edges of a subsequent switching cycle, such as for example of the directly following cycle.

According to another exemplary embodiment of the present invention as set forth in claim 5, a sub-harmonic injection is reduced by averaging an error signal corresponding to the pulse-timing errors of the switches over a predetermined number of switching cycles. Advantageously, this may allow to reduce distortions in the output signal of the digital amplifier almost completely.

According to another exemplary embodiment of the present invention as set forth in claim 6, a very simply and reliable circuitry for generating the error signal is provided which allows to produce the digital amplifier according to the present invention at low costs.

According to another exemplary embodiment of the present invention as set forth in claim 7, a switching-timing corrector is provided for correcting switching timing errors of switches of a bridge of a digital amplifier. The switching-timing corrector according to this exemplary embodiment of the present invention comprises a pulse edge delay detector for detecting and on/off difference between on-delay of a pulse supplied to the switches and an off-delay of the pulse response output by the switches. On the basis of this on/off difference, an error signal is generated, used for correcting switching-timing errors of the switches by delaying at least one of the a rising edge and a falling edge of the input signal of the switches. Such switching-timing corrector according to the present invention may advantageously be provided to an end stage of a digital amplifier to reduce distortions of the output signal of the amplifier.

Claims 8 to 10 provide for exemplary embodiments of the switching-timing corrector according to the present invention, having a simple and reliable circuit configuration, which allows for production of the switching-timing corrector according to the present invention at low costs. According to an aspect of the present invention, the switching-timing corrector according to the present invention may be provided on the same module or integrated circuit IC as the digital amplifier.

Claims 11 to 14 provide for exemplary embodiments of a method for correcting pulse-timing errors of switches of a bridge of a digital amplifier, which allow for an operation of the digital amplifier with reduced distortions and a reduced total harmonic distortion (THE)).

It may be seen as the gist of an exemplary embodiment of the present invention that according to the present invention a kind of measuring circuit is provided for measuring switching delays of the switches of the bridge configuration of the digital amplifier and a compensation circuit, which allows to compensate for these distortions by modifying the switching delay of the power stage. By this, the output pulse duration is corrected to reflect more correctly the input duty cycle. Variations in the switching time, due to device property spread, aging, current and temperature may be corrected in a simple manner.

These and other aspect of the present invention are apparent and will be elucidated with reference to the embodiments described hereinafter and with reference to the following drawings.

In the following, exemplary embodiments of the present invention will be described with reference to the Figures. In the following description, reference is made to class D amplifiers, to which the present invention may be applied. Class D amplifiers usually have a full bridge usually referred to as H-bridge. In spite of the fact that the present invention is described with reference to exemplary embodiments of class D amplifiers, it is apparent to the skilled person that the present invention is not limited to class D amplifiers, but is applicable to any kind of digital amplifier, where distortions are caused by switching-timing errors of the switches used in the digital amplifier. The present invention is also applicable to half bridge architectures.

Figure 1:
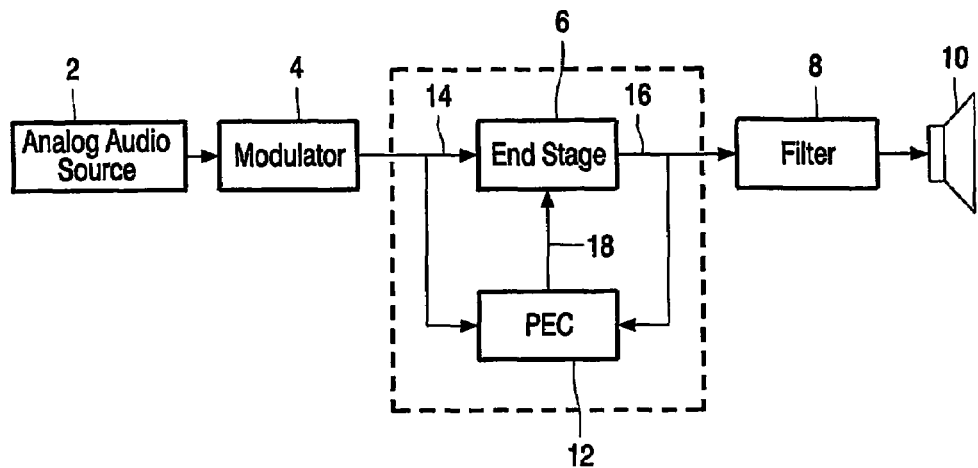
FIG. 1 shows a schematic diagram of an exemplary embodiment of a digital amplifier according to the present invention comprising an exemplary embodiment of a switching-timing corrector according to the present invention.

FIG. 1 shows a simplified schematic block diagram of a first exemplary embodiment of a digital amplifier according to the present invention for converting an audio signal to a power output. The digital amplifier depicted in FIG. 1 is a class D amplifier. Reference numeral 2 in FIG. 1 designates an audio source, which outputs an analog audio signal to a modulator 4. The modulator 4 pulse-width modulates the audio signal with a high frequency square wave, so that the signal 14 output at the output of the modulator 4 includes the audio-signal information as variations in pulse-width of the modulated signal. This modulated signal 14 feeds an end stage 6, usually a set of half bridge switches such as H-bridges. Usually, each H-bridge consists of two power MOSFETs. The output signal 16 of the end stage 6 is fed into a filter 8 for filtering the signal before the output signal of the filter 8 is applied to a loudspeaker 10. Unlike with class A or B structures, the amplifier load, i.e. the loudspeaker 10 is connected across the legs of the bridge of the end stage 6 instead of from the output to the ground. It has to be noted that the present invention may also be implemented in class D half bridge architectures. In case the present invention is applied to class D half bridge architectures, the speaker is then connected to half supply or by means of a series capacitance.

Reference numeral 12 designates a switching-timing corrector PEC according to an exemplary embodiment of the present invention for correcting switching-timing errors of the switches of the end stage 6 on the basis of the pulse-timing errors between the input signal 14 of the end stage 6 and the output signal 16 of the end stage 6. For this, as maybe taken from FIG. 1, the signals 14 and 16 are fed into the switching-timing corrector 12 and as indicated by arrow 18. The switching-timing corrector 12 corrects pulse-timing errors of the switches of the end stage 6 on the basis of the input signal 14 and the output signal 16.

Figure 2:
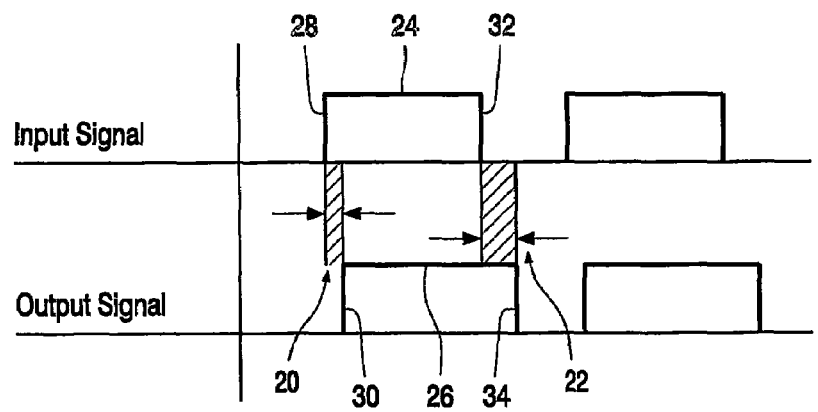
FIG. 2 is a timing chart of an input signal and an output signal of the end stage of the digital amplifier of FIG. 1 for further explaining an aspect of the present invention.

FIG. 2 shows a simplified timing chart where the input signal 14 of the end stage 6 and the output signal 16 of the end stage 6 are sketched for further explaining an aspect of the present invention. In particular, in FIG. 2 there is shown a pulse 24 of the input signal 14 and its pulse response of the end stage 6, namely the pulse 26 of the output signal 16. FIG. 2 shows that the rising edge 30 of the pulse 26 is delayed with respect to the rising edge 28 of the pulse 24 by an on-delay 20. Also, the falling edge 34 of the pulse 26 is delayed with respect to the falling edge 32 of the pulse 24 by an off-delay 22.

As mentioned above, the information of the audio signal is coded into the pulse-width of the signal 14. Thus, distortions in the duty cycle of the output signal 16 with respect to the input signal 14 cause distortions of the amplifier. In other words, in case the on-delay 20 has the same size as the off-delay 22, no distortions are caused in the output signal 16. However, as is the case in FIG. 2, usually the switches in the end stage 6 cause on-delays 20 which are different to off-delays 22.

According to the present invention, the switching-timing corrector 12 measures this on/off delay difference, i.e. the length difference of the on-delay 20 and the off-delay 22 and uses this on/off delay to compensate or correct the output signal 16. In particular, according to an aspect of the present invention, the on-delay is shifted for compensating the output signal 16.

The measurement of the on/off delay difference between the on-delay 20 and the off-delay 22 may be carried out in a digital set-up by means of up/down counters as well as in a linear implementation by the charging and discharging of a capacitor. In case a digital system is applied to high frequency switching systems, the time resolution has to be adapted accordingly.

In the following, an exemplary embodiment of a switching-timing corrector 12 is described with reference to FIG. 3, which shows a simplified circuit diagram of a switching-timing corrector according to an exemplary embodiment of the present invention. For the sake of simplicity, the same reference numerals are used as in FIG. 1 to designate the same or corresponding elements.

Figure 3:
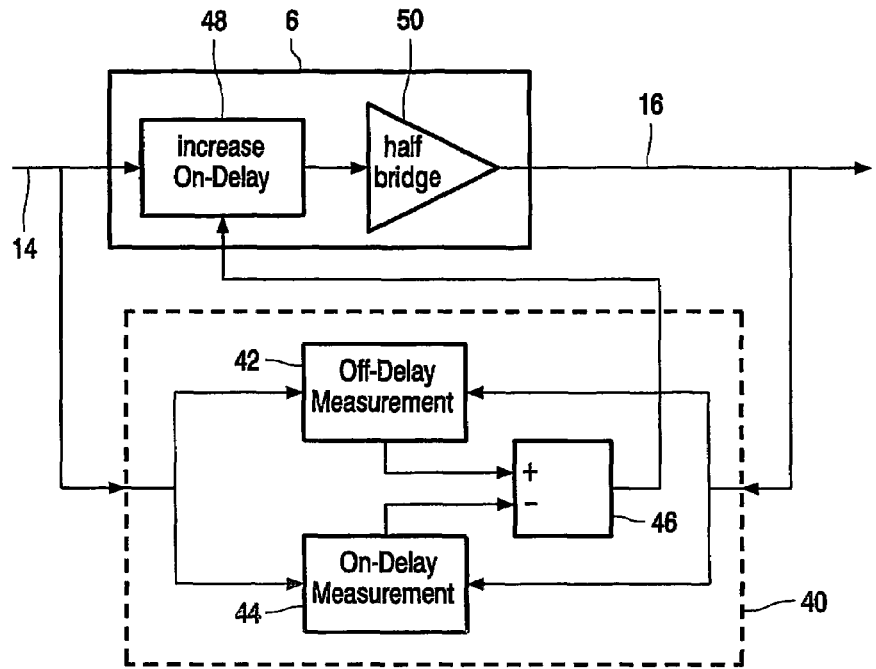
FIG. 3 shows a simplified schematic diagram of an exemplary embodiment of a switching-timing corrector according to the present invention as it may be used in the digital amplifier depicted in FIG. 1.

The switching-timing corrector depicted in FIG. 3 consists of an error signal generator 40 and a switching-timing correction circuit 48, which in this case is incorporated in the same module or IC as the end stage 6. The input signal 14 is provide to the switching-timing correction circuit 48 and to the error signal generator 40. In the error signal generator 40, the input signal 14 is provided to an off-delay measurement circuit 42 and to an on-delay measurement circuit 44. The output signal 16 of the end stage 6 is also provided to the error signal generator 40 where it is provided to the off-delay measurement circuit 42 and to the on-delay measurement circuit 44. The on-delay measurement circuit 44 determines the on-delay 20 as depicted in FIG. 2. The off-delay measurement circuit 42 determines the off-delay 22 as depicted in FIG. 2. The off-delay measurement circuit 42 provides the off-delay to a difference determinator 46, such as a subtractor, which also receives the on-delay measurement from the on-delay measurement circuit 44.

The subtractor 46 provides the on/off difference between the on-delay 20 and the off-delay 22 to the switching-timing correction circuit 48, which corrects the switching-timing in the following switching cycle. In detail, the switching-timing correction circuit 48 increases the on-delay of the subsequent rising edge 28 of the input signal 14 and provides the manipulated input signal 14 to the half bridge 50 including the switches, such that the output signal 15 has the same duty cycle as the input signal 14.

In other words, in the switching-timing corrector depicted in FIG. 3, the difference of the on-delay and the off-delay is determined by means of the error signal generator 40. This information is used to control the switching-timing generator circuit 48, which increases the on-delay 20 of a subsequent pulse of the input signal 14. According to an aspect of the present invention, the switching-timing correction circuit 48 shifts only the on-edge, which is sufficient for the case depicted in FIG. 2, where the off-delay 22 is greater than the on-delay 20. However, if the off-delay of the end stage is inherently shorter than the on-delay 20, an off-delay increasing circuit may be provided in the switching-timing correction circuit 48 to shift the off-edge. According to another aspect of the present invention, a switching-timing correction circuit 48 may be provided for shifting the on-edge and the off-edge of the pulses of the input signal 14. Instead of performing a shift of the switching edges of a subsequent switching cycle on the basis of measurements from one switching cycle as described above, according to an aspect of the present invention, it is also possible to perform on-delay and off-delay measurements over a pre-determined number of switching cycles and to average these measurements by means of an averaging circuit. The averaged measurements are then used for compensation. Advantageously, this may reduce sub-harmonic injections.

In the following, with reference to FIG. 4, an exemplary embodiment of the error signal generator for outputting the error signal to the switching-timing correction circuit 48 will be described.

Figure 4:
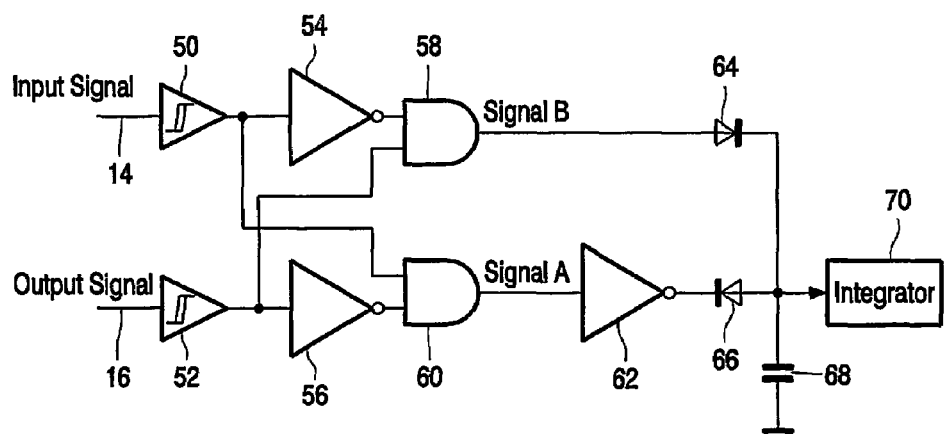
FIG. 4 shows a simplified circuit diagram of an exemplary embodiment of an error signal generator according to the present invention as it may be used in the switching-timing corrector depicted in FIG. 3.

FIG. 4 shows a simplified circuit diagram of an error signal generator according to an exemplary embodiment of the present invention.

As may be taken from FIG. 4, the input signal 14 is input to a Schmitt-trigger 50. The output signal of the Schmitt-trigger 50 is input to an inverter 54 and to an AND gate 60. The output signal of the inverter 54 is input to an AND gate 58. The output signal 16 is provided to another Schmitt-trigger 52, which output is fed to another inverter 56 and to the AND gate 58. The output of the inverter 56 is fed into the AND gate 60.

The output signal Signal B is provided via a forward biased diode 64 to an integrator 70, which input is connected to ground via a capacitor 68. The output signal Signal A of the AND gate 60 is provided to another inverter 62 and via a reverse biased diode 66 to the input of the integrator 70.

Figure 5:
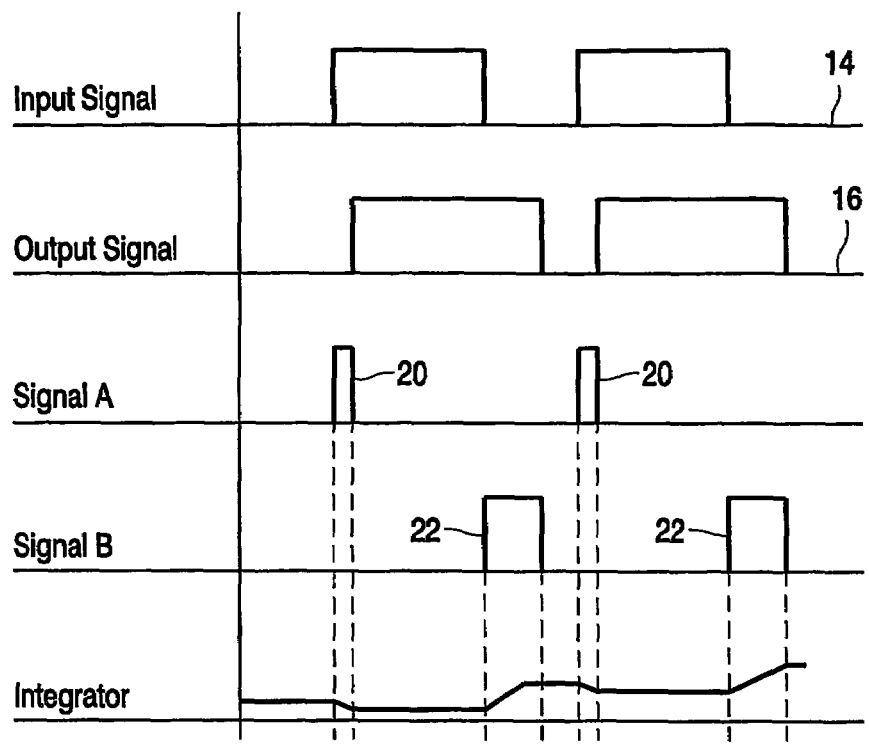
FIG. 5 shows a timing chart to further explain an exemplary embodiment of an operation of the error signal generator depicted in FIG. 4.

The operation of the error signal generator depicted in FIG. 4 will now be described with reference to FIG. 5. FIG. 5 shows a simplified timing chart sketching the input signal 14, the output signal 16, Signal A, i.e. the output signal of the AND gate 60, which represents the on-delay 20, Signal B, i.e. the output signal of the AND gate 58, which represents the off-delay 22, and the output signal of the integrator 70. As may be taken from the output signal of the integrator 70, during the on-delay 20, i.e. during the on-time of Signal A, the output signal of the integrator decreases, whereas it increases during the off-delay 22, i.e. during the on-time of Signal B.

According to an aspect of the present invention, no integrator 70 is provided in FIG. 4. Instead of the output signal of the integrator 70, the voltage across the capacitor 68 is used as the error signal.

Figure 6:
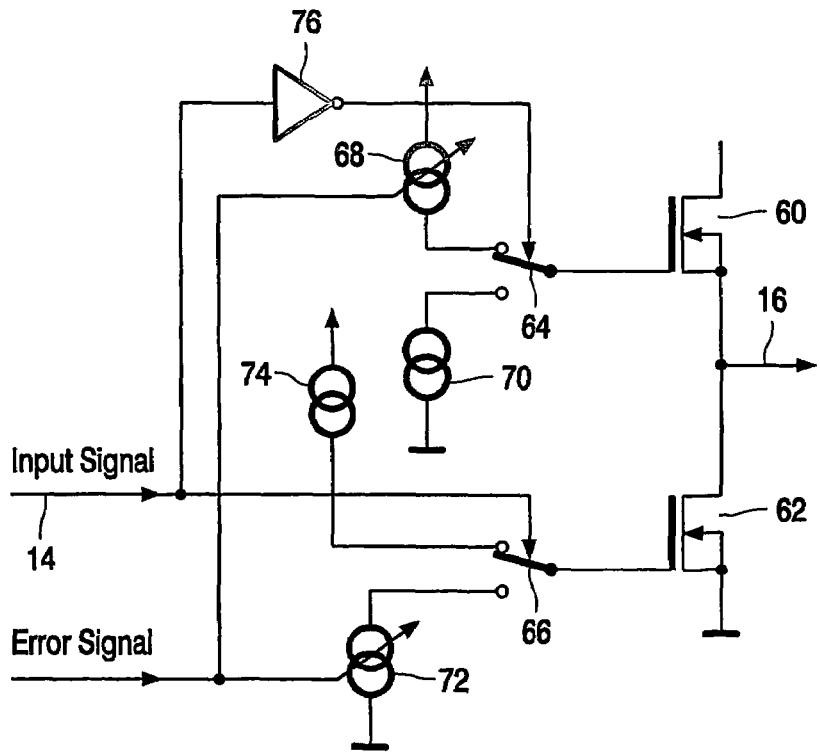
FIG. 6 shows a simplified circuit diagram of a switching-timing correction circuit according to an exemplary embodiment of the present invention as it may be used in the switching-timing corrector depicted in FIG. 3.

In the following, an exemplary embodiment of a switching-timing correction circuit 48, which allows for an on-delay increase is described with reference to FIG. 6. FIG. 6 shows a simplified circuit diagram of an edge-delay generator according to the present invention.

As may be taken from FIG. 6, the input signal 14 is used to activate switch 66, connected to the gate of the MOSFET 62. Furthermore, the input signal 14 is applied to a switch 64 via an inverter 76 for switching the switch 64 connected to the gate of MOSFET 60. The switch 64 switches the gate of the MOSFET 60 between a current source 70 and a controlled current source 68, which is controlled by means of the error signal.

The switch 66 switches the gate of the MOSFET 62 between the current source 74 and the controlled current source 72, which is controlled by the error signal.

Gate driver circuits are normally used to charge and discharge the gate capacitance of the MOSFETs 60 and 62. The driven MOSFETs 60 and 62 are switched when the respective threshold voltage is reached. According to an aspect of the present invention, these gate drivers are controlled externally by means of the error signal, which allows to shift the edge of the input signal 14.

As may be taken from FIG. 6, to use the normal gate driver while ensuring the compensation of the timing errors of the MOSFETs 60 and 62, two separate current controls, namely controlled current sources 68 and 72 are provided to control the charging and the discharging of the gate capacities of the MOSFETs 60 and 62. In this way, both the on and the off delay may be controlled.

In the circuit depicted in FIG. 6, by reducing the high side charge current, i.e. the charge current of the gate of the MOSFET 60 and simultaneously reducing the low side discharge current, i.e. the discharge current of the gate of the MOSFET 62, the rising output edge is made slower, such that the on-delay is increased.

It is apparent to the skilled person that instead of the circuit provided in FIG. 6, the edge delay implementation may also be realized by means of a digital delay in the input line, such as by means of a digital sample and hold gate.

The invention claimed is:

1. Digital amplifier, comprising: a half bridge system with switches; a switching-timing correction circuit to which an input signal and an output signal of the switches is applied; wherein the switching-timing correction circuit is configured to indicate a first delay from timing differences between respective rising edges of the input and output signals, to indicate a second delay from timing differences between respective falling edges of the input and output signals, and to correct switching timing errors of the switches responsive to an difference between the first delay and the second delay.

2. The digital amplifier of claim 1, wherein the switching-timing correction circuit corrects switching timing errors of the switches by delaying at least one of a rising edge and a falling edge of a pulse of the input signal.

3. The digital amplifier of claim 1, wherein the switching-timing correction circuit includes: a pulse edge delay detector for detecting the difference between the first delay and the second delay; and an error signal generator for generating an error signal on the basis of the difference; wherein the error signal corresponds to the pulse-timing errors between the input signal of the switches and the output signal of the switches; and wherein the switching-timing correction circuit corrects switching timing errors of the switches on the basis of the error signal.

4. The digital amplifier of claim 3, wherein the error signal is generated from one switching cycle and influences switching edges of a subsequent switching cycle.

5. The digital amplifier of claim 3, wherein the error signal is averaged over a predetermined number of switching cycles by means of an averaging circuit to reduce a sub-harmonic injection.

6. The digital amplifier of claim 3, wherein the error signal is generated by means of an integration capacitor; and wherein the digital amplifier is a class D amplifier.

7. Switching-timing corrector for correcting switching timing errors of switches of a bridge of a digital amplifier, the switching-timing corrector comprising: a pulse edge delay detector for detecting a difference between a first delay of a pulse supplied to the switches and a second delay of the pulse response output by the switches, the first delay representing a timing difference between a rising edge of the pulse and a rising edge of the pulse response, and the second delay representing a timing difference between a falling edge of the pulse and a falling edge of the pulse response; an error signal generator for generating an error signal on the basis of the difference; an input pulse delay circuit for correcting switching timing errors of the switches by delaying at least one of a rising edge and a falling edge of a pulse of the input signal on the basis of the error signal.

8. The switching-timing corrector of claim 7, wherein the error signal is generated from one switching cycle and influences switching edges of a subsequent switching cycle.

9. The switching-timing corrector of claim 7, wherein the error signal is averaged over a predetermined number of switching cycles by means of an averaging circuit to reduce a sub-harmonic injection.

10. The switching-timing corrector of claim 7, wherein the error signal is generated by means of an integration capacitor; and wherein the switching-timing corrector is adapted for connection to a class D amplifier.

11. Method of correcting pulse-timing errors of switches of a bridge of a digital amplifier, the method comprising the steps of: detecting rising and falling pulse edges of an input and an output signal of the switches; generating an error signal corresponding to pulse edge delays between the rising and falling pulse edges of the input and the output signal; and correcting switching timing errors of the switches on the basis of the error signal.

12. The method of claim 11, wherein the switching timing errors of the switches are corrected by delaying at least one of the rising edge and the falling edge of a pulse of the input signal.

13. The method of claim 11, wherein the error signal is generated from one switching cycle and influences switching edges of a subsequent switching cycle, and further comprising indicating a first delay by measuring a timing difference between the rising edge of a pulse of the input signal supplied to the switches and the rising edge of a pulse of the output signal output by the switches responsive to the rising edge of the pulse of the input signal; and indicating a second delay by measuring a timing difference between the falling edge of the pulse of the input signal and the falling edge of the pulse of the output signal output by the switches responsive to the falling edge of the pulse of the input signal, wherein the error signal is generated responsive to determining the difference between the first delay and the second delay.

14. The method of claim 11, wherein the error signal is averaged over a predetermined number of switching cycles by means of an averaging circuit to reduce a sub-harmonic injection.

15. The switching-timing corrector of claim 7, wherein the pulse edge delay detector includes a first delay measurement circuit that determines the first delay, a second delay measurement circuit that determines the second delay, and a subtractor that determines the difference between from the first delay and the second delay 16. The switching-timing corrector of claim 15, wherein the error signal generator includes an integrator that integrates the difference to produce the error signal.

17. The switching-timing corrector of claim 16, wherein the integrator is an integration capacitor.

18. The switching-timing corrector of claim 7, wherein the switches of the bridge are MOSFETs, and wherein the input pulse delay circuit controls charging and discharging of each MOSFET gate capacities.

19. The switching-timing corrector of claim 18, wherein for each MOSFET the input pulse delay circuit includes control circuitry that switches between current sources based on the input signal, one of the current sources being controlled by the error signal.

20. The digital amplifier of claim 1, wherein the switching-timing correction circuit includes a first delay measurement circuit that indicates the first delay responsive to measuring a timing difference between a rising edge of a pulse of the input signal supplied to the switches and a rising edge of a pulse of the output signal output by the switches responsive to the rising edge of the pulse of the input signal, a second delay measurement circuit that indicates the second delay responsive to measuring a timing difference between a falling edge of the pulse of the input signal and a falling edge of the pulse of the output signal output by the switches responsive to the falling edge of the pulse of the input signal, and a subtractor that determines the difference between the first delay and the second delay.

* * * * *